(12) United States Patent
Prieto Herrera et al.

(10) Patent No.: US 10,480,833 B2
(45) Date of Patent: Nov. 19, 2019

(54) HEAT-TRANSFERRING AND ELECTRICALLY CONNECTING DEVICE AND ELECTRONIC DEVICE

(71) Applicants: STMicroelectronics (Crolles 2) SAS, Crolles (FR); STMicroelectronics SA, Montrouge (FR)

(72) Inventors: Rafael Augusto Prieto Herrera, Grenoble (FR); Jean-Philippe Colonna, Corenc (FR); Perceval Coudrain, Grenoble (FR)

(73) Assignees: STMicroelectronics (Crolles 2) SAS, Crolles (FR); STMicroelectronics SA, Montrouge (FR)

( * ) Notice: Subject to any disclaimer, the term of this patent is extended or adjusted under 35 U.S.C. 154(b) by 0 days.

(21) Appl. No.: 15/801,505

(22) Filed: Nov. 2, 2017

(65) Prior Publication Data

US 2018/0142923 A1 May 24, 2018

(30) Foreign Application Priority Data

Nov. 21, 2016 (FR) ...................... 16 61261

(51) Int. Cl.
*F25B 15/00* (2006.01)
*F28F 3/00* (2006.01)
(Continued)

(52) U.S. Cl.
CPC ................ *F25B 15/00* (2013.01); *F28F 3/00* (2013.01); *G06F 1/20* (2013.01); *H01L 23/4275* (2013.01); *H01L 23/433* (2013.01); *H01L 23/4985* (2013.01); *H05K 7/2029* (2013.01); *H05K 7/2039* (2013.01)

(58) Field of Classification Search
CPC .................. H05K 7/20; H05K 7/2029; H05K 7/20309–20318; H05K 7/2039; H05K 7/20336; H05K 7/20409; H05K 7/20809; H05K 7/20881; H05K 7/20854; H05K 7/20936; H01L 23/367; H01L 23/427; H01L 23/4985; G06F 1/20; F28B 15/00; F28F 3/00
USPC .............. 361/700–704, 708, 679.52–679.54; 165/80.4–80.5, 104.33; 257/714
See application file for complete search history.

(56) References Cited

U.S. PATENT DOCUMENTS 5,224,030 A * 6/1993 Banks ...................... F28F 21/02
165/185
5,703,397 A * 12/1997 Endo ....................... H01L 23/10
257/697

(Continued)

OTHER PUBLICATIONS

INPI Search Report and Written Opinion for FR 1661261 dated Jul. 31, 2017 (8 pages).

*Primary Examiner* — Dion Ferguson
*Assistant Examiner* — Amir A Jalali
(74) *Attorney, Agent, or Firm* — Crowe & Dunlevy

(57) ABSTRACT

A heat-transferring device is formed by a stack that includes at least one heat-conducting layer and at least one heat-absorbing layer. The at least one heat-conducting layer has at least one heat-collecting section placed facing a heat source and at least one heat-evacuating section placed facing a heat sink. The at least one heat-absorbing layer includes a phase-change material. One face of the at least one heat-absorbing layer is adjoined to at least one portion of at least one face of the heat-conducting layer.

25 Claims, 6 Drawing Sheets

(51) Int. Cl.
    *H05K 7/20*      (2006.01)
    *G06F 1/20*      (2006.01)
    *H01L 23/498*    (2006.01)
    *H01L 23/427*    (2006.01)
    *H01L 23/433*    (2006.01)

(56) References Cited

U.S. PATENT DOCUMENTS

| | | | |
|---|---|---|---|
| 6,392,883 B1 | 5/2002 | Ali | |
| 6,661,660 B2* | 12/2003 | Prasher | H01L 23/427 165/104.33 |
| 7,246,940 B2* | 7/2007 | Storm | E21B 36/001 165/104.33 |
| 9,271,427 B2* | 2/2016 | Kilroy | H01L 23/367 |
| 2003/0007329 A1 | 1/2003 | Hill | |
| 2003/0111213 A1* | 6/2003 | Chang | F28D 15/02 165/104.33 |
| 2007/0023892 A1* | 2/2007 | Gauche | H01L 23/427 257/712 |
| 2008/0123291 A1* | 5/2008 | Wang | G11B 33/1406 361/688 |
| 2008/0160330 A1* | 7/2008 | Song | B32B 15/08 428/545 |
| 2008/0289810 A1* | 11/2008 | Okabayashi | B32B 27/00 165/185 |
| 2010/0321895 A1* | 12/2010 | Hill | H05K 7/20472 361/715 |
| 2014/0158334 A1* | 6/2014 | Dellea | F28D 15/00 165/185 |
| 2015/0220122 A1* | 8/2015 | Rhee | G06F 1/203 361/679.52 |
| 2015/0268704 A1* | 9/2015 | Chiriac | F28F 21/00 361/679.54 |
| 2015/0348895 A1* | 12/2015 | Sen | H05K 1/0366 257/774 |
| 2016/0143179 A1* | 5/2016 | Shocket | H05K 1/181 361/719 |
| 2017/0038055 A1* | 2/2017 | Daniels | H01L 24/00 |
| 2018/0042139 A1* | 2/2018 | Rosales | H01L 23/3735 |

* cited by examiner

HEAT-TRANSFERRING AND ELECTRICALLY CONNECTING DEVICE AND ELECTRONIC DEVICE

PRIORITY CLAIM

This application claims the priority benefit of French Application for Patent No. 1661261, filed on Nov. 21, 2016, the disclosure of which is hereby incorporated by reference in its entirety.

TECHNICAL FIELD

The present invention relates to the field of devices able to evacuate the heat produced by heat sources and in particular by electronic or electrical components.

BACKGROUND

To evacuate the heat produced by electronic integrated circuit chips, it is known to associate therewith metal heat-transferring members equipped with radiators or connected to walls of an apparatus. Nevertheless, these solutions are unsuitable and not very effective especially when the available volumes are small or when the electronic chips are remote.

SUMMARY

According to one embodiment, provision is made for a heat-transferring device comprising a stack that comprises: at least one heat-conducting layer having at least one heat-collecting section able to be placed facing a heat source and at least one heat-evacuating section able to be placed facing a heat sink; and at least one heat-absorbing layer including a phase-change material and one face of which is adjoined to at least one portion of at least one face of said heat-conducting layer.

At least one of said sections of said heat-conducting layer has at least one face covered by the heat-absorbing layer.

The stack may comprise an alternation of heat-conducting layers and heat-absorbing layers.

Said sections of said heat-conducting layers may be respectively devoid therebetween of heat-absorbing layers and may be adjoined.

Said heat-conducting layer may comprise a metal sheet or a sheet made of graphite.

Said heat-conducting layer may comprise at least one sheet made of a heat-conducting material and at least one face of which is covered with a layer made of an electrically insulating material.

Said heat-absorbing layer may comprise at least one jacket containing the phase-change material.

Said jacket may be made of a flexible electrically insulating material.

Said phase-change material may comprise an organic material, a metallic material or a mineral material.

Said stack may take the form of a flexible strip.

Provision is also made for a heat-transferring and electrically connecting device that comprises a heat-transferring device such as above, wherein said stack furthermore comprises at least one electrically connecting layer.

Said electrically connecting layer may be placed on a face of said heat-conducting layer which is opposite said heat-absorbing layer.

Said electrically connecting layer may be interposed between said heat-conducting layer and said heat-absorbing layer.

Said electrically connecting layer may comprise a sheet made of an electrically insulating material, in which an electrically connecting network is included.

Provision is also made for an electronic device that comprises at least one electrical or electronic component and at least one heat-transferring device such as above, wherein said component is mounted above said heat-collecting section of said heat-conducting layer and a heat-dissipating member is mounted above said heat-evacuating section of said heat-conducting layer.

Provision is also made for an electronic device that comprises at least one electrical or electronic component and at least one heat-transferring and electrically connecting device such as above, wherein said electronic component is mounted above said heat-collecting section of said heat-conducting layer and is electrically connected to said electrically connecting layer and a heat-dissipating member is mounted above said heat-evacuating section of said heat-conducting layer.

Said heat-dissipating member may comprise a printed circuit board, this printed circuit board being electrically connected to said electrically connecting layer.

Said component may comprise an electronic chip.

BRIEF DESCRIPTION OF THE DRAWINGS

Heat-transferring and heat-transferring and electrically connecting devices and electronic devices will now be described by way of non-limiting examples, said devices being illustrated in the drawings, in which.

DETAILED DESCRIPTION

Figure 1:
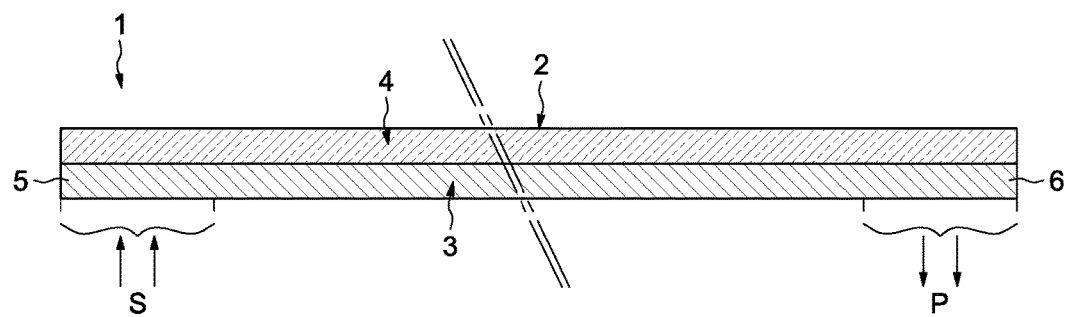
FIGS. 1 to 7 show longitudinal cross sections through variant embodiments of heat-transferring devices.

FIGS. 1 to 6 illustrate a heat-transferring device 1 able to evacuate at least some of the heat produced by a heat source S to a heat sink P located a distance away from the heat source S.

The heat-transferring device 1 comprises a stack 2 of superposed and adjoined layers, which comprises at least one heat-conducting layer 3 and at least one heat-absorbing layer 4 that at least partially cover each other in many possible arrangements. The heat-conducting layer 3 has sections 5 and 6 that are remote from each other and respectively able to be placed one facing the heat source S and the other facing the heat sink P.

The stack 2 takes, for example, the form of a rectangular elongate strip so that the sections 5 and 6 are longitudinally spaced apart and may in particular be located adjacently to the opposite ends of the heat-conducting layer 3, in the direction of the length of this strip, or in proximity to the ends of this strip.

Optionally, the heat-transferring device 1 may be flexible, so that the sections 5 and 6 may be placed and orientated one with respect to the other in light of the arrangements and orientations of the heat source S and the heat sink with respect to each other.

Figure 2:
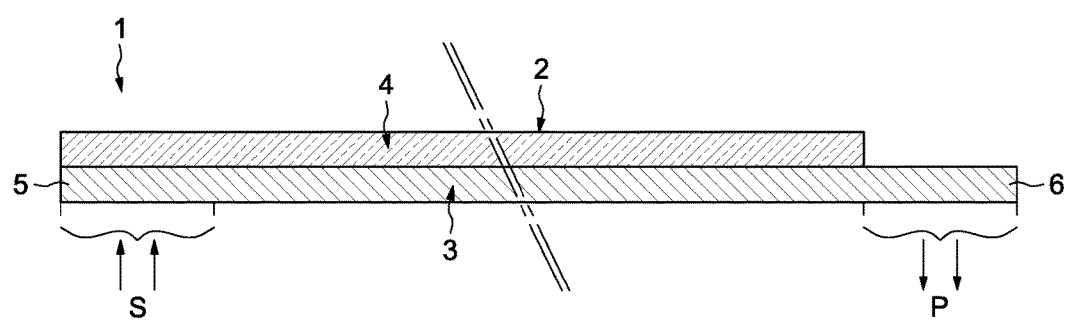
Figure 3:
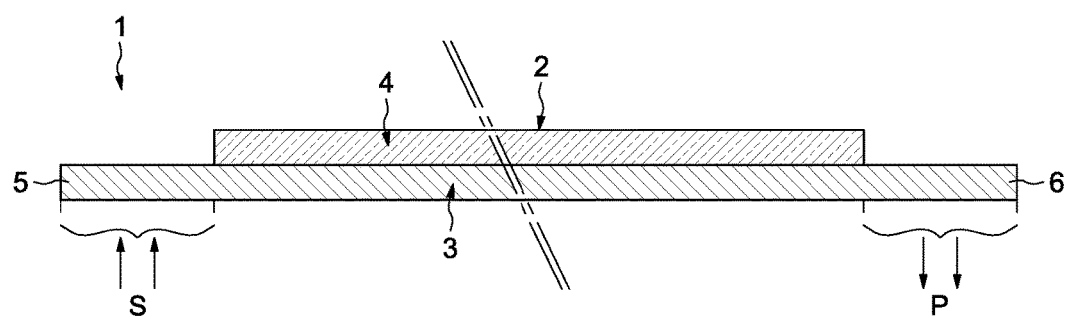

According to the exemplary embodiment illustrated in FIGS. 1 to 3, the heat-transferring device 1 comprises a heat-conducting layer 3 and a heat-absorbing layer 4.

According to one variant embodiment illustrated in FIG. 1, the heat-conducting layer 3 and the heat-absorbing layer 4 cover each other. In this case, the end sections 5 and 6 of the heat-conducting layer 3 have faces covered by the heat-absorbing layer 4 and exposed faces opposite the heat-absorbing layer 4.

According to one variant embodiment illustrated in FIG. 2, the heat-absorbing layer 4 locally covers some of the length of the heat-conducting layer 3, starting from one end of the latter and without reaching the other end. In this case, for example, the end section 5 of the heat-conducting layer 3 has a face covered by the heat-absorbing layer 4 and an exposed face opposite the heat-absorbing layer 4, whereas the opposite faces of the end section 6 of the heat-conducting layer 3 are both exposed.

According to one variant embodiment illustrated in FIG. 3, the heat-absorbing layer 4 locally covers some of the length of the heat-conducting layer 3, without reaching the ends of the heat-conducting layer 3. In this case, the opposite faces of the end sections 5 and 6 of the heat-conducting layer 3 are respectively exposed.

Figure 4:
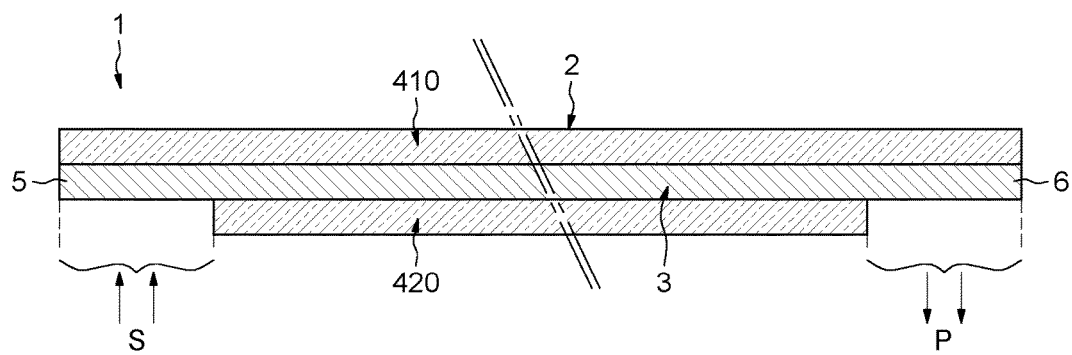
Figure 5:
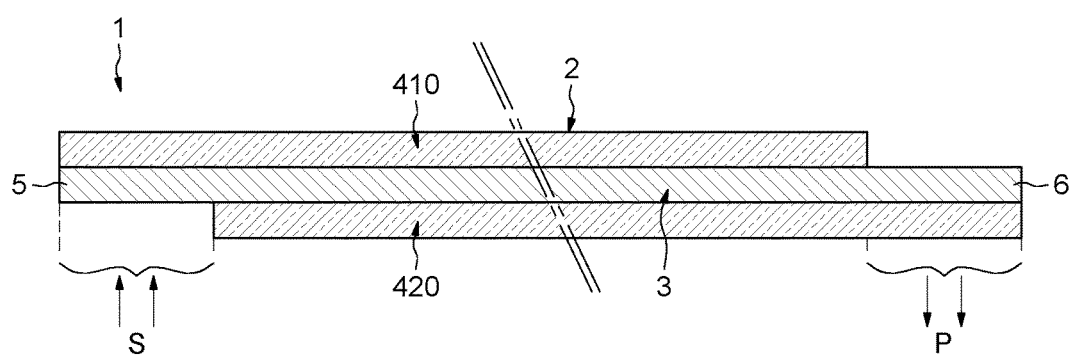
Figure 6:
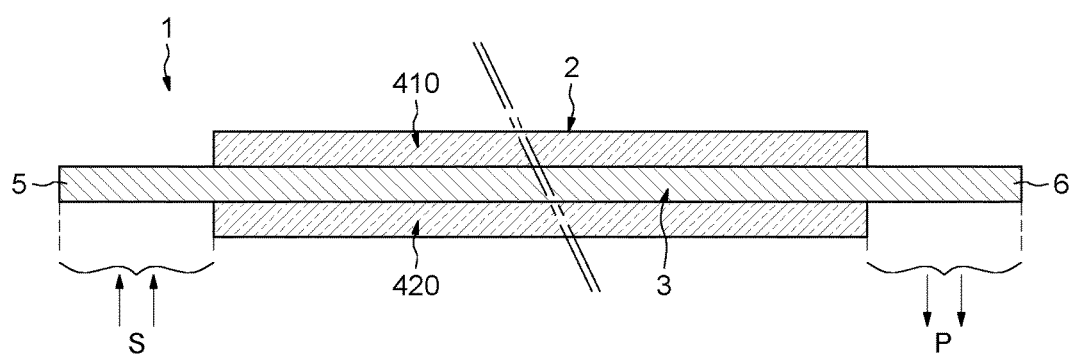

According to the exemplary embodiment illustrated in FIGS. 4 to 6, the heat-transferring device 1 comprises a heat-conducting layer 3 and two heat-absorbing layers 410 and 420 that are respectively located on opposite sides (or surfaces) of the heat-conducting layer 3.

According to one variant embodiment illustrated in FIG. 4, the first heat-absorbing layer 410 completely covers one face of the heat-conducting layer 3 and the second absorbing layer 420 locally covers the other face of the heat-conducting layer 3 so that the end sections 5 and 6 of the heat-conducting layer 3 have exposed faces on the side of this second absorbing layer 420.

According to one variant embodiment illustrated in FIG. 5, first and second heat-absorbing layers 410 and 420 locally cover the faces of the heat-conducting layer 3, so that the end section 5 of the heat-conducting layer 3 has an exposed face on the side of the second absorbing layer 420 and so that the end section 6 of the heat-conducting layer 3 has an exposed face on the side of the first absorbing layer 410.

According to one variant embodiment illustrated in FIG. 6, first and second heat-absorbing layers 410 and 420 locally cover the faces of the heat-conducting layer 3, so that the opposite faces of the end sections 5 and 6 of the heat-conducting layer 3 are exposed.

Figure 7:
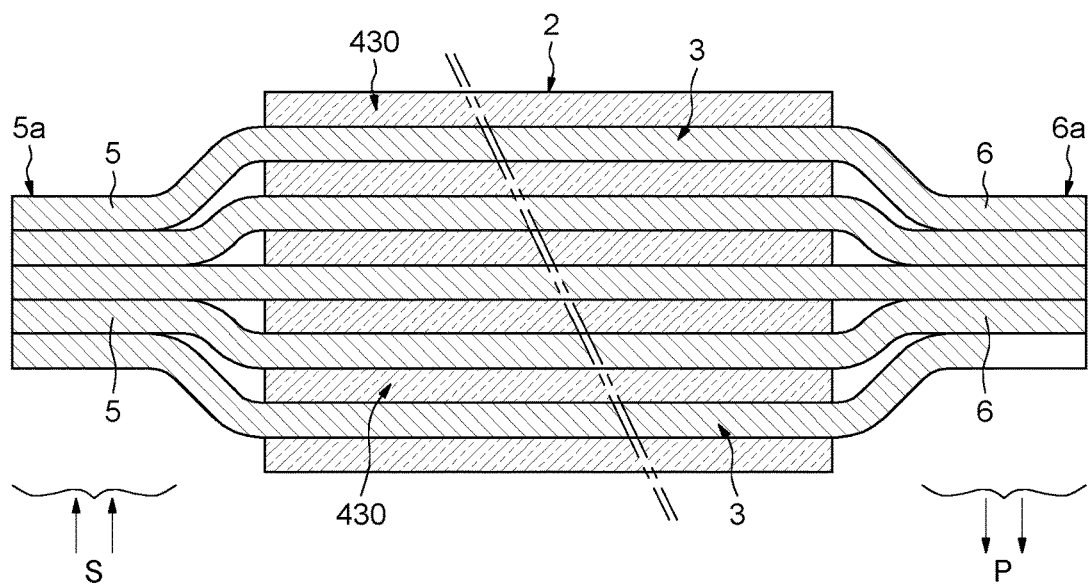

According to one exemplary embodiment illustrated in FIG. 7, the heat-transferring device 1 comprises an alternation of heat-conducting layers 3 and heat-absorbing layers 430. The heat-absorbing layers 430 locally cover some of the length of the heat-conducting layers 3, without reaching the ends of these heat-conducting layers 3. In this case, the opposite faces of the end sections 5 and 6 of the heat-conducting layers 3 are respectively exposed. The end sections 5 and 6 of the heat-conducting layers 3 are respectively brought together and adjoined so as to be superposed, so as to form stacks 5*a* and 6*a* of end sections 5 and 6, the opposite faces of these stacks 5*a* and 6*a* being exposed.

The heat-transferring device 1 may operate in the following way.

Generally, depending on the temperature variations and differences between the end sections 5 and 6 of the heat-conducting layer 3, or the temperature variations and differences between the heat-conducting layer 3 and the heat-absorbing layer 4, heat may be transferred from the heat source S to the heat sink P via the heat-conducting layer 3 and, at the same time, heat may be exchanged between the heat-conducting layer 3 and the heat-absorbing layer 4.

In an initial state, the heat source and the heat sink are at room (or ambient) temperature.

In particular, the temperature of the heat source S may reach values located in a temperature range, for example, comprised between forty degrees Celsius (40° C.) and one hundred and twenty degrees Celsius (120° C.) and the heat sink P may remain at room (or ambient) temperature.

The melting point of the heat-conducting layer 3 is much higher than this temperature range.

The heat-conducting layer 3 may comprise at least one sheet made of a metal or a metal alloy or a graphite-based or graphite sheet. This sheet may furthermore be covered, on one of its faces or on both its faces, with a protective layer, for example one made of an electrically insulating material such as a polymer and in particular a polyimide.

The heat-absorbing layer 4, 410, 420, 430 may comprise a solid/liquid phase-change material contained in a jacket. The temperature at which this phase change occurs is included in said temperature range and is below the temperature that the heat source S may reach.

For example, the phase-change material of the heat-absorbing layer 4, 410, 420, 430 may comprise an organic material such as paraffin, a metallic material or an alloy such as gallium or indium or a mineral material such as a salt hydrate. The jacket may be flexible in order to accommodate variations in the volume of the phase-change material and may be made of an electrically insulating material, a polymer such as a polyimide for example.

Figure 8:
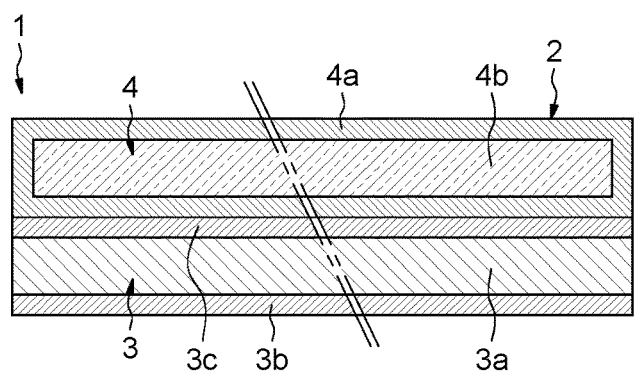
FIG. 8 shows a detailed transverse cross section through the above heat-transferring devices.

As illustrated by way of example in FIG. 8, the heat-conducting layer 3 comprises a heat-conducting sheet 3*a* equipped, on both its faces, with electrically insulating layers 3*b* and 3*c*. The heat-absorbing layer 4 comprises a jacket 4*a* containing a phase-change material 4*b*. In this case, the heat-conducting layer 3 and the heat-absorbing layer 4 may be adjoined by adhesion to a layer 3*b* and to one face of the jacket 4*a*.

The thickness of the heat-conducting layer 3 may be comprised between twenty and two hundred microns and the thickness of the heat-absorbing layer 4 may be comprised between twenty and five hundred microns.

Figure 9:
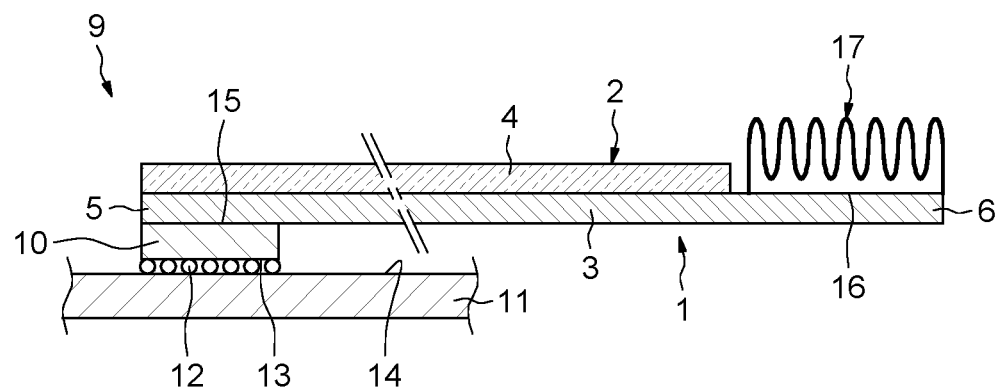
FIG. 9 shows a longitudinal cross section through a variant embodiment of an electronic device including a heat-transferring device.
Figure 10:
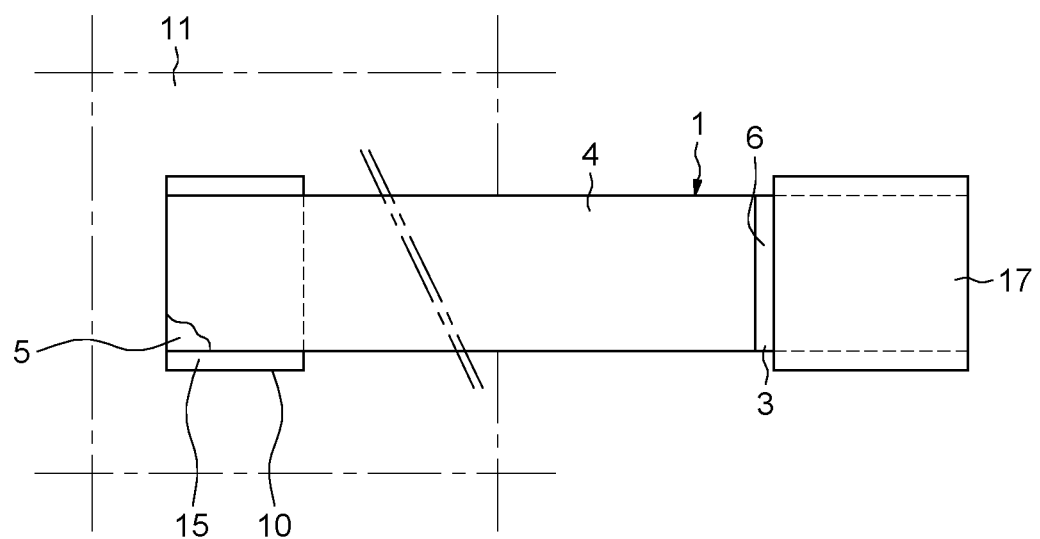
FIG. 10 shows a top view of the electronic device in FIG. 9.

According to one exemplary application illustrated in FIGS. 9 and 10, an electronic device 9 comprises a heat-transferring device 1 chosen from any one of those described (non-limitingly) with reference to FIGS. 1 to 7, for at least partially dissipating the heat produced by an electronic component such as an electronic chip 10, or any other electronic component such as a battery. The heat-transferring device 1 shown in these figures is that in FIG. 1.

The chip 10 is mounted on a printed circuit board 11 by way of electrically connecting bumps 12 that are interposed between a front face 13 of the chip 10 and a face 14 of the printed circuit board 11.

An exposed face of the section 5 of the heat-conducting layer 3 is fastened flat to a back face 15 of the chip 10, opposite its front face 13, by way of a layer of heat-conducting adhesive.

An exposed face of the section 6 of the heat-conducting layer 3 is fastened flat to a face 16 of a dissipating radiator 17 located a distance away from the chip 10, by way of a layer of heat-conducting adhesive. The dissipating radiator 17 is placed in the ambient environment.

The heat-transferring device 1 is able to establish a heat flow between the chip 10 and the radiator 17. The section 5 constitutes a heat-collecting section and the section 6 constitutes a heat-evacuating section.

When the temperature of the chip 10 increases, an amount of the heat produced by the chip 10 is collected by the section 5 of the heat-conducting layer 3. An amount of the heat of the section 5 of the heat-conducting layer 3 is conveyed by the latter, by conduction, as far as its section 6, the heat of which is evacuated to the radiator 17. The heat of the radiator 17 is dissipated to the ambient environment. At the same time, since the temperature of the heat-conducting layer 3 has increased, an amount of the heat of the heat-conducting layer 3 is transferred to the absorbing layer 4, by conduction via the interface between the heat-conducting layer 3 and the absorbing layer 4.

If the temperature of the chip 10 remains below the phase-change temperature of the solid/liquid phase-change material of the absorbing layer 4, this phase-change material remains solid. The temperatures of the heat-conducting layer 3 and of the absorbing layer 4 change conjointly and their variations substantially follow the changes in the temperature of the chip 10.

If in contrast the temperature of the chip 10 increases further, the temperature of the heat-conducting layer 3 increases further. The amount of heat absorbed by the absorbing layer 4 and released from the heat-conducting layer 3 increases until the temperature of the phase-change material of the absorbing layer 4 reaches the phase-change temperature of this material, consequently the phase-change material of the absorbing layer 4 gradually passes from the solid state to the liquid state while remaining substantially at this phase-change temperature as long as all the phase-change material has not passed to the liquid state.

When the temperature of the chip 10 decreases, the temperature of the heat-conducting layer 3 decreases and the heat of the absorbing layer 4 is transferred to the heat-conducting layer 3. The temperature of the absorbing layer 4 decreases and the absorbing material gradually passes from the liquid state to the solid state.

As a result of the above, the heat-transferring device 1, by virtue of the absorbing layer 4, is able to form a means for preventing the temperature of the chip 10 from rising substantially above the phase-change temperature of the solid/liquid phase-change material of the absorbing layer 4.

The heat-transferring device 1 being suitably dimensioned, in particular as regards the volume of the solid/liquid phase-change material of the heat-absorbing layer 4, the temperature reachable by the chip 10 is limited to a maximum value. Thus, possible peaks in the increase in the temperature of the chip 10, due to particular brief operating states, may be avoided.

Figure 11:
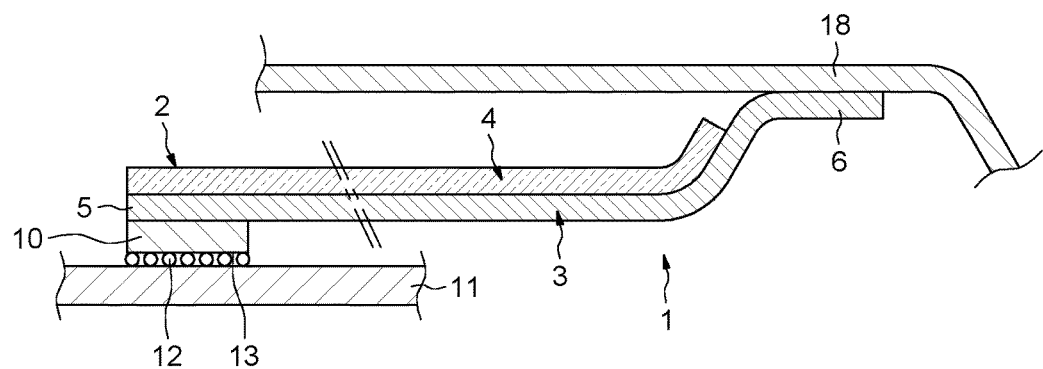
FIG. 11 shows a longitudinal cross section through a variant embodiment of the electronic device in FIG. 9.

According to one variant application illustrated in FIG. 11, the end portion 6 of the heat-transferring device 1 is adjoined, not to a radiator, but to a zone of a casing 18 of an electronic apparatus, in which casing the printed circuit board 11 equipped with the chip 10 is located. This casing 18 is able to form a means for dissipating heat to the ambient environment.

Figure 12:
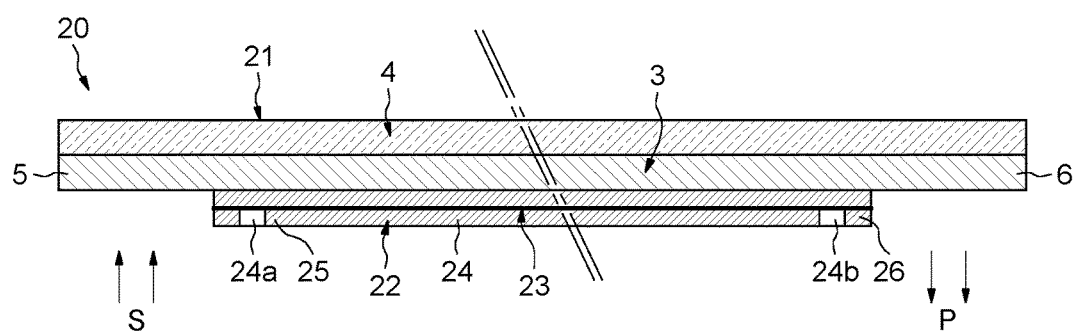
FIG. 12 shows a longitudinal cross section through a variant embodiment of a heat-transferring and electrically connecting device.
Figure 13:
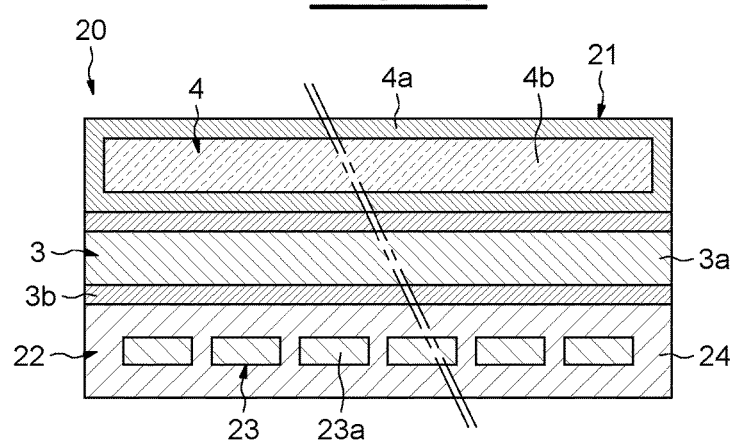
FIG. 13 shows a detailed transverse cross section through the heat-transferring and electrically connecting device in FIG. 12.
Figure 14:
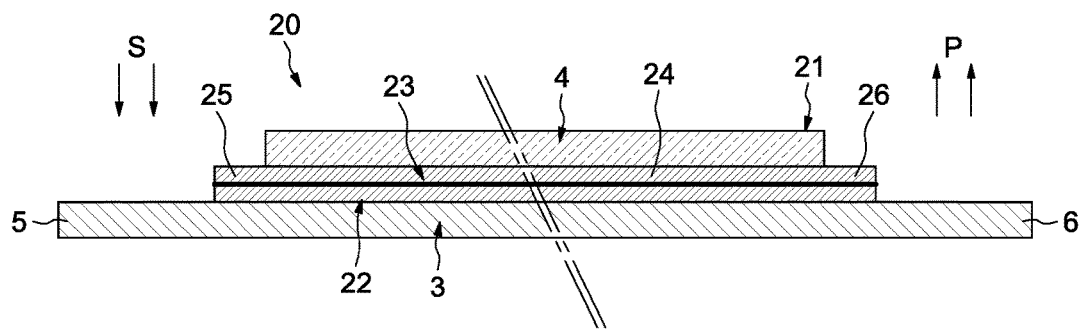
FIG. 14 shows a longitudinal cross section through another variant embodiment of a heat-transferring and electrically connecting device.

FIGS. 12 to 14 illustrate a heat-transferring device 20 able to evacuate at least some of the heat produced by a heat source S to a heat sink P located a distance away from the heat source S.

The heat-transferring device 20 comprises a stack 21 that comprises a heat-transferring device equivalent to one of those described (non-limitingly) above with reference to FIGS. 1 to 7, namely at least one heat-conducting layer 3 and at least one heat-absorbing layer 4.

The stack 21 of the heat-transferring device 20 furthermore comprises at least one additional electrically connecting layer 22 including an electrically connecting network 23 able to electrically connect electronic components. The electrically connecting network 23 comprises points of electrical contact for this purpose.

According to one exemplary embodiment illustrated in FIGS. 12 and 13, the heat-transferring device 20 comprises a heat-transferring device 1 equivalent to one of those described above with reference to FIGS. 1 to 3, namely a heat-conducting layer 3 and a heat-absorbing layer 4 that are adjoined. The heat-transferring device 1 shown in FIGS. 12 and 13 is in particular equivalent to that described above with reference to FIG. 1.

The stack 21 of the heat-transferring device 20 comprises an electrically connecting layer 22 one face of which is adjoined to the exposed face of the heat-conducting layer 3 opposite the heat-absorbing layer 4.

The electrically connecting layer 22 may take the form of a strip and comprise an electrically insulating material 24, for example made of a polymer such as a polyimide, in which an electrically connecting network 23, for example made up of a plurality of longitudinal metal lines 23a, is embedded.

The electrically connecting layer 22 extends over at least some of the length of the heat-conducting layer 3. By way of example and as illustrated in FIG. 12, the electrically connecting layer 22 leaves exposed the end sections 5 and 6 of the heat-conducting layer 3.

The electrically connecting network 23 is accessible through the electrically insulating material 24, at the ends or in proximity to the ends of the electrically connecting layer 22, in such a way that the electrically connecting network 23 is able to electrically connect electronic components located in the vicinity of or mounted on the exposed faces of the sections 5 and 6 of the heat-conducting layer 3. For example, spaced holes 24a and 24b are produced through the material 24. These holes give access locally, pairwise, to points of the lines 23a of the electrically connecting network 23.

According to one exemplary embodiment illustrated in FIG. 14, the heat-transferring device 20 comprises a stack 21 that comprises a heat-conducting layer 3 and a heat-absorbing layer 4, which layers are spaced apart from one another, and an electrically connecting layer 22 that is interposed between the heat-conducting layer 3 and the heat-absorbing layer 4. The heat-conducting layer 3 and the heat-absorbing layer 4 are adjoined or adhesively bonded to opposite faces of the electrically connecting layer 22.

The longitudinal arrangement of the heat-conducting layer 3 and the heat-absorbing layer 4, with respect to each other, may be according to one of the arrangements described with reference to FIGS. 1 to 3.

In FIG. 14 in particular the longitudinal arrangement of the layers 3 and 4 is equivalent to that in FIG. 3. In this case, the electrically connecting layer 22 has end sections 25 and 26 extending beyond the ends of the heat-absorbing layer 4, without covering the end sections 5 and 6 of the heat-conducting layer 3. These end sections 25 and 26 may contain holes 24a and 24b allowing access to the electrically connecting network 23. The electrically connecting layer 22 is placed between the layers 3 and 4.

The stack 21 of the heat-transferring device 20 may furthermore comprise an additional heat-absorbing layer 4 that is adjoined or adhesively bonded to that face of the heat-conducting layer 3 which is opposite the electrically connecting layer 22, in one of the longitudinal arrangements described above with reference to FIGS. 4 to 7.

According to one exemplary application illustrated in FIG. 15, an electronic device 29 comprises a heat-transferring device 20 chosen from any one of those described with reference to FIGS. 12 to 14 and intended to electrically connect an electronic component such as an electronic chip 30 to a printed circuit board 31 and, at the same time, to at least partially dissipate the heat produced by this chip 30.

Figure 15:
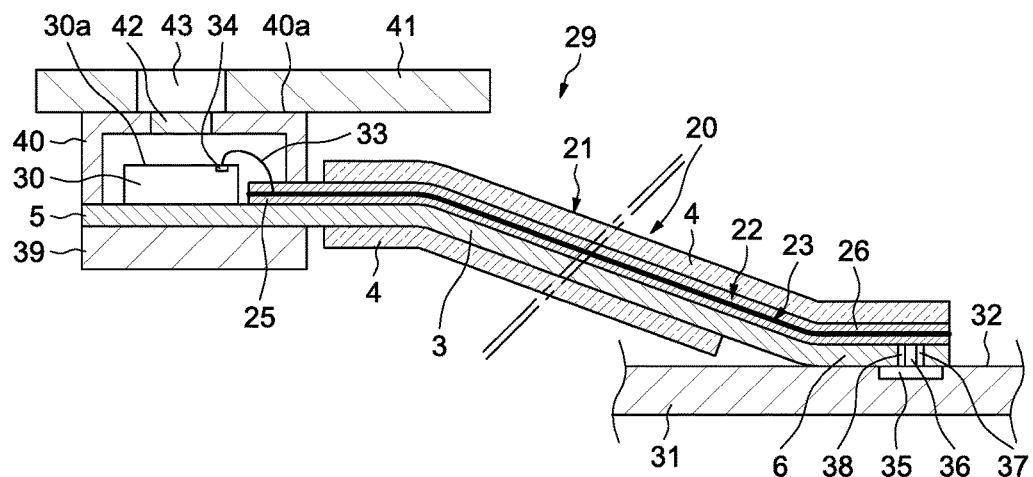
FIG. 15 shows a longitudinal cross section through a variant embodiment of an electronic device including a heat-transferring and electrically connecting device.

The heat-transferring device 20 shown in FIG. 15 in particular comprises a heat-conducting layer 3. The chip 30 is mounted on one face of the end section 5 for collecting heat of the heat-conducting layer 3. One face of the end section 6 for evacuating heat of the heat-conducting layer 3 is adjoined to a zone of one face 32 of the printed circuit board 31. The chip 30 and the printed circuit board 31 are located on either side of the heat-conducting layer 3.

The heat-transferring device 20 comprises an electrically connecting layer 22 that extends over the face of the heat-conducting layer 3 located on the side of the chip 30 and opposite the printed circuit board 31, and that extends from the end of the end section 6 of the heat-conducting layer 3 as far as into proximity with the chip 30.

The electrically conducting layer 22 comprises an electrically connecting network 23 allowing the chip 30 and the printed circuit board 31 to be electrically connected.

To do this, on the one hand the electrically connecting network 23 is connected to the chip 30 by electrically connecting wires 33 one end of which are engaged in an end section 25 of the electrically connecting layer 22 and the other end of which are connected to front electrically connecting pads 34 of a frontal face 30a of the chip 30, which is opposite the end section 5 of the heat-conducting layer 3.

On the other hand, the electrically connecting network 23 of the electrically connecting layer 22 is connected to electrically connecting pads 35 of the face 32 of the printed circuit board 31 by way of local electrically connecting vias 36 that pass through holes 37 in the heat-conducting layer 3 and that are electrically insulated from the latter by virtue of insulating rings 38 that are interposed between the vias 36 and the holes 37. The electrically connecting vias 36 are engaged in an end section 26 of the electrically connecting layer 22.

The heat-transferring device 20 also comprises a first heat-absorbing layer 4 that extends over the electrically connecting layer 22, from its end 26 as far as into proximity with the electrically connecting wires 33.

The heat-transferring device 20 furthermore comprises an opposite second heat-absorbing layer 4 that extends over the face of the heat-conducting layer 3 from a location located in proximity to the end section 5 of this heat-conducting layer 3 as far as to a location corresponding to the end of the first heat-absorbing layer 4 near the electrically connecting wires 33.

A reinforcing plate 39 is mounted on that face of the end section 5 of the heat-conducting layer 3 which is opposite the chip 5.

The chip 30 and the electrically connecting wires 33 are encapsulated in an added cover 40 that is mounted on the end section 5 of the heat-conducting layer 3, the end section 25 of the electrically connecting layer passing under this cover 40.

A frontal face 40a of the cover 40 is fastened against an internal face of a wall 41 of a casing of an electronic apparatus, for example a mobile telephone or an electronic tablet, inside of which the printed circuit board 31 is placed. In such an arrangement, in which the wall 41 is a distance away from the printed circuit board 31, the heat-transferring device 20 is curved, the chip 30 being remote with respect to the printed circuit board 31.

In particular, the front face 30a of the chip 30 includes an image sensor able to capture images through a lens 42 of the frontal wall of the cover 40 and a hole 43 provided in the wall 40 of the casing of the electronic apparatus, the lens letting light pass.

Alternatively, the cover 40 could be replaced by an encapsulating block formed on the section 5 of the electrically conductive layer 3, in which block the chip 30 and the electrically connecting wires 33 would be embedded.

As a result of the above the heat-transferring device 20 is able to at least partially evacuate the heat produced by the chip 30 to the printed circuit board 31 by combining the effects of the heat-conducting layer 3 and of the heat-absorbing layers 4, as was described above, and, at the same time, is able to create electrical connections between the chip 30 and the printed circuit board 31 via the electrically connecting network 23.

According to one variant embodiment, the end section 26 of the electrically connecting layer 22 could extend beyond the heat-conducting layer 3 in order to be directly connected to the printed circuit board 31, without connection through the heat-conducting layer 3.

According to one variant embodiment, the chip could be mounted on an electrically connecting board including an integrated electrically connecting network, said board being connected on the one hand to the chip via electrically connecting wires and on the other hand to an electrically connecting layer adjoined to a first heat-conducting layer the evacuating section of which would be placed above the printed circuit board.

In this variant embodiment, a heat-collecting section of a second heat-conducting layer could be interposed between the chip and this electrically connecting board and be passed through by the electrically connecting wires, and an evacuating section of this second heat-conducting layer could be placed above the evacuating section of the first heat-conducting layer.

According to another variant embodiment, the phase-change material of the heat-absorbing layer could exhibit a solid/solid phase change and for example be chosen from the polyurethanes.

The invention claimed is:

1. A heat-transferring device, comprising a stack, said stack including:
a plurality of heat-conducting layers having a first length, the plurality of heat-conducting layers including:
at least one heat-collecting section of a first face of a given one of the plurality of heat-conducting layers and configured to be placed facing a heat source; and at least one heat-evacuating section of the first face of the given one of the plurality of heat-conducting layers and configured to be placed facing a heat sink; and a plurality of heat-absorbing layers having a second length, each heat-conducting layer being between two of the plurality of heat-absorbing layers, each heat-absorbing layer including a phase-change material;

wherein the second length is less than the first length:

wherein the plurality of heat-conducting layers and plurality of heat-absorbing layers are physically arranged such that first and second opposing ends of each heat-conducting layer extend beyond each heat-absorbing layer, and such that the first and second opposing ends of each of the heat-conducting layers are pinched so that the first ends of each of the heat-conducting layers make contact with one another and so that the second ends of each of the heat-conducting layers make contact with one another:

wherein the at least one heat-collecting section of the first face of the given one of the plurality of heat-conducting layers is located at the first end of the given one of the plurality of heat-conducting layers: and wherein the at least one heat-evacuating section of the first face of the given one of the plurality of heat-conducting layers is located at the second end of the given one of the plurality of heat-conducting layers.

2. The device according to claim 1, wherein the stack comprises an alternation of a plurality of said heat-conducting layers and a plurality of said heat-absorbing layers.

3. The device according to claim 1, wherein said plurality of heat-conducting layers each comprise a metal sheet or a sheet made of graphite.

4. The device according to claim 1, wherein said plurality of heat-conducting layers each comprise at least one sheet made of a heat-conducting material and at least one face of which is covered with a layer made of an electrically insulating material.

5. The device according to claim 1, wherein said plurality of heat-absorbing layers each comprise at least one jacket containing the phase-change material.

6. The device according to claim 5, wherein said jacket is made of a flexible electrically insulating material.

7. The device according to claim 1, wherein said phase-change material comprises a material selected from the group consisting of an organic material, a metallic material and a mineral material.

8. The device according to claim 1, wherein said stack takes the form of a flexible strip.

9. A heat-transferring and electrically connecting device, comprising:

a heat-transferring device comprising a stack, said stack including:

a plurality of heat-conducting layers having a first length, the plurality of heat-conducting layers including:

at least one heat-collecting section of a first face of a given one of the plurality of heat-conducting layers and configured to be placed facing a heat source; and at least one heat-evacuating section of the first face of the given one of the plurality of a heat-conducting layers and configured to be placed facing a heat sink; and a plurality of heat-absorbing layers having a second length, each heat-conducting layer being between two of the plurality of heat-absorbing layers, each heat-absorbing layer including a phase-change material;

wherein the second length is less than the first length:

wherein the plurality of heat-conducting layers and plurality of heat-absorbing layers are physically arranged such that first and second opposing ends of each heat-conducting layer extend beyond each heat-absorbing layer, and such that the first and second opposing ends of each of the heat-conducting layers are pinched so that the first ends of each of the heat-conducting layers make contact with one another and so that the second ends of each of the heat-conducting layers make contact with one another:

wherein the at least one heat-collecting section of the first face of the given one of the plurality of heat-conducting layers is located at the first end of the given one of the plurality of heat-conducting layers:

wherein the at least one heat-evacuating section of the first face of the given one of the plurality of heat-conducting layers is located at the second end of the given one of the plurality of heat-conducting layers: and at least one electrically connecting layer.

10. The device according to claim 9, wherein said electrically connecting layer is placed on the first face of one of the plurality of heat-conducting layers.

11. The device according to claim 9, wherein said electrically connecting layer comprises a sheet made of an electrically insulating material, in which an electrically connecting network is included.

12. The device according to claim 9, wherein said one heat-collecting section and said one heat-evacuating section of the given one of the plurality of heat-conducting layers has at least one face covered by at least one of the plurality of heat-absorbing layers.

13. The device according to claim 9, wherein each of the plurality of heat-conducting layers comprise a metal sheet or a sheet made of graphite.

14. The device according to claim 9, wherein each of the plurality of heat-conducting layers comprised of at least one sheet made of a heat-conducting material and at least one face of which is covered with a layer made of an electrically insulating material.

15. The device according to claim 9, wherein each of the plurality of heat-absorbing layers comprised of at least one jacket containing the phase-change material.

16. The device according to claim 15, wherein said jacket is made of a flexible electrically insulating material.

17. The device according to claim 9, wherein said phase-change material comprises a material selected from the group consisting of an organic material, a metallic material and a mineral material.

18. The device according to claim 9, wherein said stack takes the form of a flexible strip.

19. An electronic device, comprising:

at least one electrical or electronic component; and at least one heat-transferring device comprising a stack, said stack including:

a plurality of heat-conducting layers having a first length, the plurality of heat-conducting layers including:

at least one heat-collecting section of a first face of a given one of the plurality of the heat-conducting layers and configured to be placed facing a heat source, the at least one heat-collecting section being located on a first end of the first face; and at least one heat-evacuating section of the first face of the given one of the plurality of the heat-conducting layers and configured to be placed facing a heat sink, the at least one heat-evacuating section being located on a second end of the first face, the second end of the first face being spaced apart from the first end of the first face along a length of the given one of the plurality of heat-conducting layers, the length of the given one of the plurality of heat-conducting layers being greater than a width of and a thickness of the given one of the plurality of heat-conducting layers;

a plurality of heat-absorbing layers having a second length, each heat-conducting layer being between two of the plurality of heat-absorbing layers, each heat-absorbing layer including a phase-change material and one face that is adjoined to a second face of a corresponding one of the plurality of heat-conducting layers;

wherein the second length is less than the first length;

wherein the plurality of heat-conducting layers and plurality of heat-absorbing layers are physically arranged such that first and second opposing ends of each heat-conducting layer extend beyond each heat-absorbing layer, and such that the first and second opposing ends of each of the heat-conducting layers are pinched so that the first ends of each of the heat-conducting layers make contact with one another and so that the second ends of each of the heat-conducting layers make contact with one another;

wherein the at least one heat-collecting section of the first face of the given one of the plurality of heat-conducting layers is located at the first end of the given one of the plurality of heat-conducting layers;

wherein the at least one heat-evacuating section of the first face of the given one of the plurality of heat-conducting layers is located at the second end of the given one of the plurality of heat-conducting layers; and at least one electrically connecting layer;

said at least one electrical or electronic component being mounted above said at least one heat-collecting section of said given one of the plurality of heat-conducting layers and electrically connected to said at least one electrically connecting layer; and a heat-dissipating member mounted above said at least one heat-evacuating section of said given one of the plurality of heat-conducting layers.

20. The device according to claim 19, wherein said electrically connecting layer is placed on a first face of the given one of the plurality of heat-conducting layers.

21. The device according to claim 19, wherein said electrically connecting layer comprises a sheet made of an electrically insulating material, in which an electrically connecting network is included, said at least one electrical or electronic component electrically connected to the electrically connecting network.

22. The device according to claim 19, wherein said heat-dissipating member comprises a printed circuit board, said printed circuit board being electrically connected to said electrically connecting layer.

23. The device according to claim 19, wherein said at least one electrical or electronic component comprises an electronic chip.

24. The device according to claim 19, wherein the heat-dissipating member is directly mechanically connected to the at least one heat-evacuation section of the given one of the plurality of heat-conducting layers.

25. The device according to claim 19, wherein the second end of the first face is spaced apart from the first end of the first face along an entirety of the length of the given one of the plurality of heat-conducting layers.

* * * * *